United States Patent
Noguchi (10) Patent No.: US 7,309,838 B2
(45) Date of Patent: Dec. 18, 2007

(54) MULTI-LAYERED CIRCUIT BOARD ASSEMBLY WITH IMPROVED THERMAL DISSIPATION

(75) Inventor: Takashi Noguchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/891,127

(22) Filed: Jul. 15, 2004

(65) Prior Publication Data

US 2006/0011383 A1    Jan. 19, 2006

(51) Int. Cl.
*H05K 1/03* (2006.01)

(52) U.S. Cl. .................. 174/255; 174/260; 174/261; 174/262; 174/263; 174/264; 174/521; 174/526; 174/546; 174/547; 361/760; 361/761; 361/762; 361/763; 361/764

(58) Field of Classification Search ............... 174/255, 174/52.4, 260–264, 524, 526, 546–547, 521; 371/762–765; 361/760–761, 762–765
See application file for complete search history.

(56) References Cited

U.S. PATENT DOCUMENTS

| | | | | |
|---|---|---|---|---|
| 4,827,328 A | * | 5/1989 | Ozawa et al. | 361/765 |
| 4,849,284 A | * | 7/1989 | Arthur et al. | 428/325 |
| 5,290,624 A | * | 3/1994 | Bujard | 428/209 |
| 5,391,924 A | * | 2/1995 | Uchida et al. | 257/789 |
| 5,500,785 A | * | 3/1996 | Funada | 361/720 |
| 5,586,007 A | * | 12/1996 | Funada | 361/720 |
| 5,597,643 A | * | 1/1997 | Weber | 428/209 |
| 5,900,312 A | * | 5/1999 | Sylvester | 428/322.7 |
| 6,111,308 A | * | 8/2000 | Newman | 257/676 |
| 6,117,710 A | * | 9/2000 | Mostafazadeh et al. | 438/123 |
| 6,307,755 B1 | * | 10/2001 | Williams et al. | 361/813 |
| 6,353,189 B1 | * | 3/2002 | Shimada et al. | 174/255 |
| 6,538,210 B2 | * | 3/2003 | Sugaya et al. | 174/258 |
| 6,713,851 B1 | * | 3/2004 | Umehara et al. | 257/675 |
| 6,784,022 B2 | * | 8/2004 | Umehara et al. | 438/111 |
| 6,855,892 B2 | * | 2/2005 | Komatsu et al. | 174/256 |
| 6,955,948 B2 | * | 10/2005 | Asahi et al. | 438/125 |

FOREIGN PATENT DOCUMENTS

JP    2002-329939    11/2002

* cited by examiner

*Primary Examiner*—Dean A. Reichard
*Assistant Examiner*—Hoa C Nguyen
(74) *Attorney, Agent, or Firm*—Rabin & Berdo, PC

(57) ABSTRACT

A circuit board assembly includes an electrical component mounted on or in the assembly; a conductive layer, which is electrically connected to the electrical component; a high-temperature dissipation resin, which is of insulating material and is arranged so as to dissipate heat generated in the assembly; and a molding resin surrounding the electrical component. Heat, generated at electrical components in a circuit board assembly, is transferred and dispersed through the high-temperature dissipation material all over the assembly. Further, since the high-temperature dissipation resin is of an insulating material, it is unnecessary to consider a short-circuit problem in the assembly.

24 Claims, 8 Drawing Sheets

MULTI-LAYERED CIRCUIT BOARD ASSEMBLY WITH IMPROVED THERMAL DISSIPATION

TECHNICAL FIELD OF THE INVENTION

The present invention relates to a multi-layered circuit board assembly. In more detail, the present invention relates to a SIP (System-In-Package) having electrical components therein.

BACKGROUND OF THE INVENTION

In recent years, electrical components are mounted within a circuit board in order to improve electrical characteristics, including integration degree, smaller size packaging and lower noise affection. After electrical components are mounted in a circuit board, wiring layers (conductive layers) are layered thereon by a build-up method to form a multi-layered circuit board assembly. The electrical components and wiring layers are resin-molded.

However, according to a conventional multi-layered circuit board, heat generated from electrical components is hardly radiated and dissipated out of the assembly. As a result, a heat resistance is increased and power consumption is increased as well. Further, the assembly may be deformed due to such an undesired heat, and as a result, a reliability of the product is decreased.

OBJECTS OF THE INVENTION

An object of the present invention to provide a multi-layered circuit board assembly, in which heat is dissipated efficiently.

Another object of the present invention to provide a method for fabricating a multi-layered circuit board assembly, in which heat is dissipated efficiently.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to an aspect of the present invention, a circuit board assembly includes an electrical component mounted on or in the assembly; a conductive layer, which is electrically connected to the electrical component; a high-temperature dissipation resin that is arranged so as to dissipate heat generated in the assembly; and a molding resin surrounding the electrical component.

The high-temperature dissipation resin may be formed at least on the conductive layer. The high-temperature dissipation resin may be formed to be in contact with the electrical component.

A circuit board assembly may further include a via hole formed in the molding resin, wherein the high-temperature dissipation resin is filled in the via hole.

Preferably, the high-temperature dissipation resin is arranged to form a heat transfer path, through which a heat generated in the assembly is well dispersed. The high-temperature dissipation resin may be made of a silica-alumina system material having an emissivity of about 0.92.

A circuit board assembly may further include a core substrate formed in the assembly, wherein the high-temperature dissipation resin is coated on a surface of the core substrate. The high-temperature dissipation resin may be formed on both surfaces of the core substrate.

A circuit board assembly may further include a conductive frame, which is formed in the assembly and extends out of the assembly to be electrically connected to an external board. The conductive frame may be of copper.

According to the present invention, heat, generated at electrical components in a circuit board assembly, is transferred and dispersed through the high-temperature dissipation material all over the assembly. As a result, it can be prevent increase of a heat resistance and power consumption. Further, the assembly may not be deformed due to such a heat, and as a result, a reliability of the product becomes high.

According to another aspect of the present invention, a method for fabricating a multi-layered circuit board assembly, included the steps of: providing a core substrate; coating a high-temperature dissipation material on both surface of the core substrate; forming ac conductive layers; mounting electrical components on the conductive layers; and resin-molding the electrical components.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
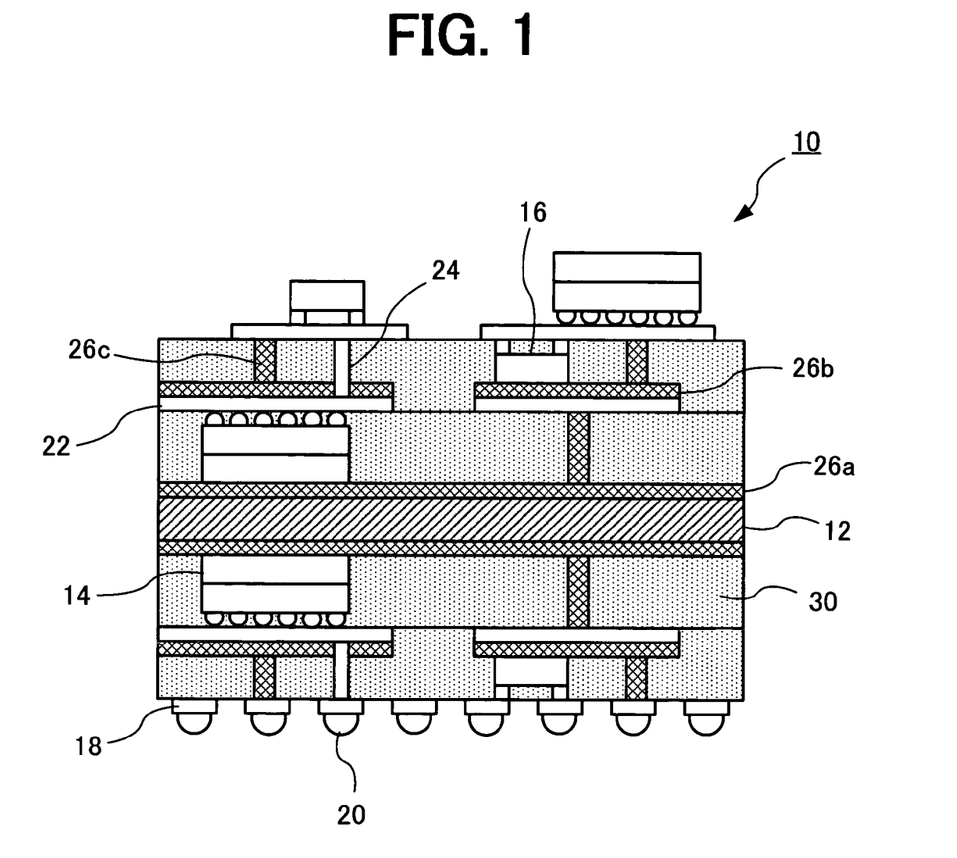
FIG. 1 is a cross-sectional view illustrating a multi-layered circuit board assembly according to a first preferred embodiment of the present invention.

FIG. 1 is a cross-sectional view illustrating a multi-layered circuit board assembly 10 according to a first preferred embodiment of the present invention. The multi-layered circuit board assembly 10 includes electrical components (14 and 16) mounted on or in the assembly; conductive layers (22), which is electrically connected to the electrical components (14 and 16); high-temperature dissipation resins (26a, 26b and 26c), which are arranged so as to disperse heat generated in the assembly 10; and a molding resin 30 surrounding the electrical component (14 and 16).

The multi-layered circuit board assembly 10 further includes a core substrate 12; electrodes 18; connecting terminals 20 and through holes (via holes) 24 for electrical connection. The connecting terminals 20 may be solder balls.

The electrical components include semiconductor chips 14 and passive devices 16. The core substrate 12 is made of a glass epoxy material. The molding resin 30 is of an epoxy resin, such as prepreg. The high-temperature dissipation resin 26a is coated on both surfaces of the core substrate 12. The high-temperature dissipation resin 26b is coated on a surface of intermediate conductive layers 22, which are formed inside the assembly 10. Another high-temperature dissipation resin 26c is filled in via holes for non-electrical connection but for heat transfer.

The semiconductor chips 14 are mounted directly onto the high-temperature dissipation resin 26a. Connection terminals of the semiconductor chips 14 are electrically connected to the conductive layers 22. The passive device 16 is mounted directly onto the high-temperature dissipation resin 26b.

The high-temperature dissipation resins 26a, 26b and 26c are designed and arranged to form a heat transfer path, through which a heat generated in the assembly 10 is well transferred and dispersed. The high-temperature dissipation resins 26a, 26b and 26c may be made of a silica-alumina system material having an emissivity of about 0.92. The high-temperature dissipation resin is an insulation material but not electrically conductive.

In general, ceramics has lower heat conductivity than metal, such as copper; however, ceramics has higher emmisivity (0.92) than copper (0.03). According to the present invention, a high-temperature dissipation material only transfer heat without making a short-circuit. A liquid state ceramics can be used as the high-temperature dissipation material (resin), which may be "Cerac-α" produced by Ceramission, Ltd., Tokyo, Japan.

The multi-layered circuit board assembly 10 is fabricated using a build-up method after the electrical components 14 and 16 are mounted.

Figure 2A:
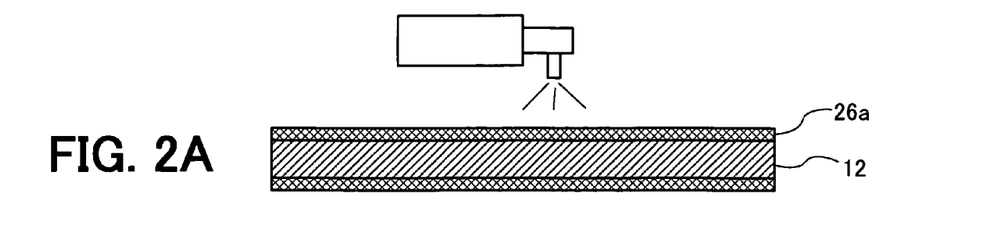
FIGS. 2A-2F are cross-sectional views illustrating fabrication steps of a multi-layered circuit board assembly, shown in FIG. 1.
Figure 2B:
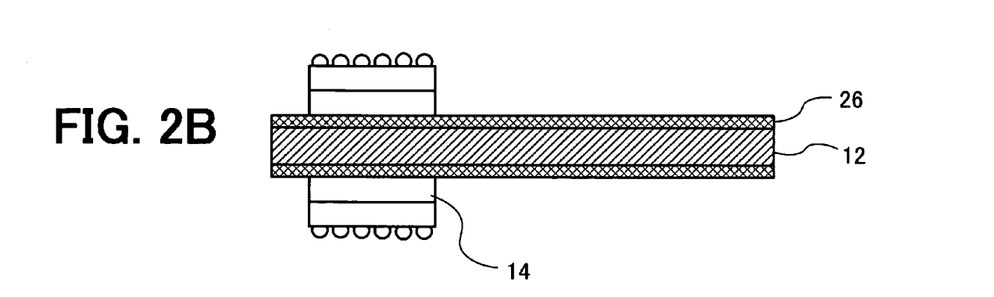

FIGS. 2A-2F are cross-sectional views illustrating fabrication steps of the multi-layered circuit board assembly 10 shown in FIG. 1. First, as shown in FIG. 2A, a high-temperature dissipation resin is sprayed and coated on both surface of the core substrate 12. Next, as shown in FIG. 2B, bottom surfaces of the semiconductor chips 14 are directly mounted onto the high-temperature dissipation resin. After that, the resin is thermo-set to form the high-temperature dissipation layer 26a having a thickness of about 30 μm to 200 μm.

Figure 2C:
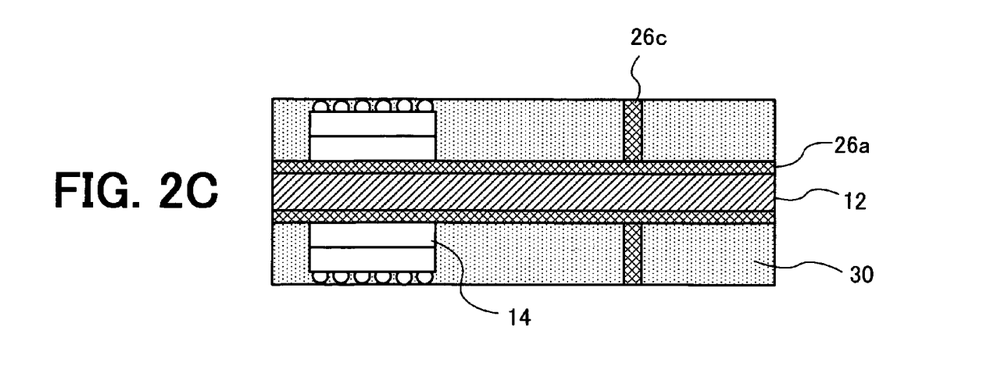

Subsequently, the semiconductor chips 14 are resin-molded with an epoxy resin, such as prepreg, and the resin is thermo-set to form the molding resin 30, as shown in FIG. 2C. The molding resin layer 30 has holes extending to the high-temperature dissipation layer 26a. The holes are filled with a high-temperature dissipation resin and is heated to be hardened. The high-temperature dissipation resin 26c in the holes are functioning as a heat path to transfer heat generated in the assembly, especially at electrical components 14 and 16, toward outside.

Figure 2D:
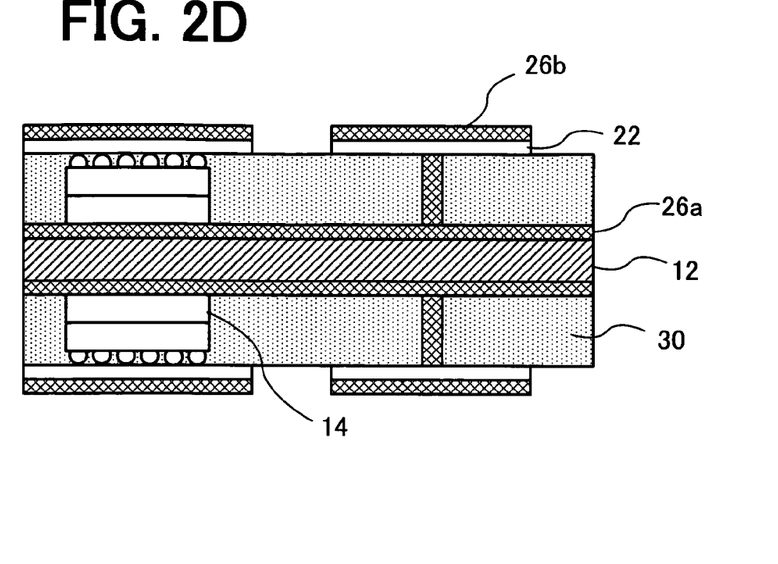

Next, conductive patterns (conductive layers) 22 are formed in a sputtering process and a plating process, then, a high-temperature dissipation resin is coated on the conductive layers 22. After that, the resin is heated to be hardened to form the high-temperature dissipation layers 26b, as shown in FIG. 2D. Electrodes of the semiconductor chips 14 are electrically connected to the conductive layers 22.

Figure 2E:
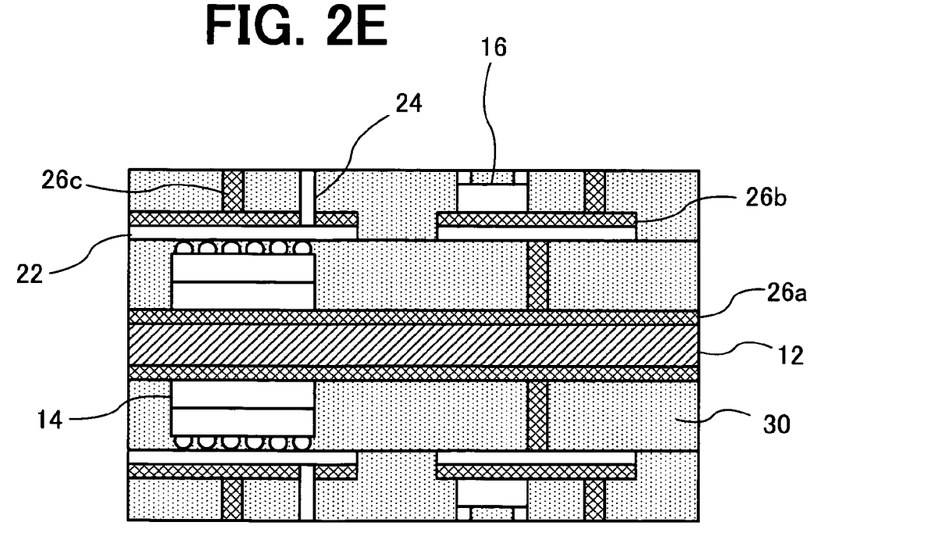

Subsequently, as shown in FIG. 2E, the passive devices 16 are mounted onto the high-temperature dissipation layers 26, and are resin-molded. The resin is thermo-set (heated to be hardened) to form the molding resin layer 30 having holes (via holes) extending to the high-temperature dissipation layer 26b. The holes are filled with a high-temperature dissipation resin and the resin is heated to be hardened. The high-temperature dissipation resin 26c in the holes are functioning as a heat path to transfer heat generated in the assembly, especially at electrical components 14 and 16, outwardly. In the molding resin 30, through holes 24 are formed for electrical connection.

Figure 2F:
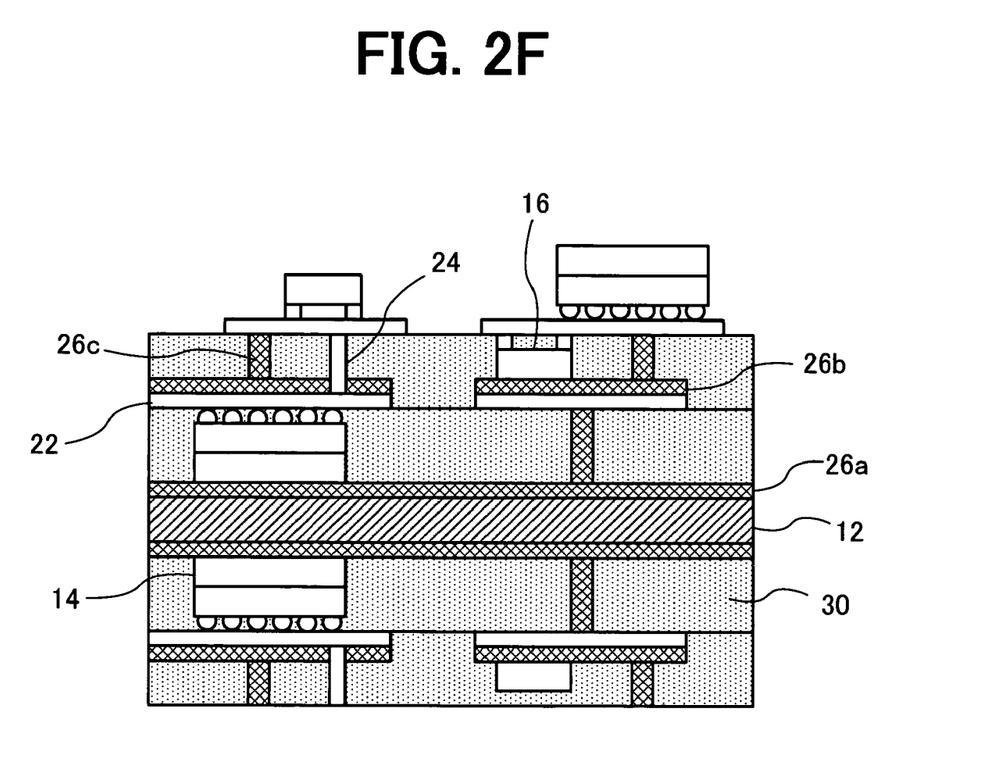

As shown in FIG. 2F, conductive layers 22 are formed on the upper most surface of the assembly and electrical components (14 and 16) are mounted on the conductive layers 22. After that, as shown in FIG. 1, electrodes 18 for external connection are formed on the bottom surface of the assembly and connection terminals, such as solder balls, 20 are provided on the electrodes 18. Thus fabricated multi-layered circuit board assembly 10 may be mounted on a motherboard.

According to the above-described first preferred embodiment, heat, generated at electrical components in the assembly, is transferred and dispersed through the high-temperature dissipation resins 26a, 26b and 26c to the core substrate 12 and connection terminals 20, so that heat is dissipated all over the assembly. As a result, it can be prevent increase of a heat resistance and power consumption. Further, the assembly may not be deformed due to such a heat, and as a result, a reliability of the product becomes high.

Further, since the high-temperature dissipation resin is of an insulating material, it is unnecessary to consider a short-circuit problem in the assembly. In other words, freedom of circuit design is not disturbed by the high-temperature dissipation resin.

Figure 3:
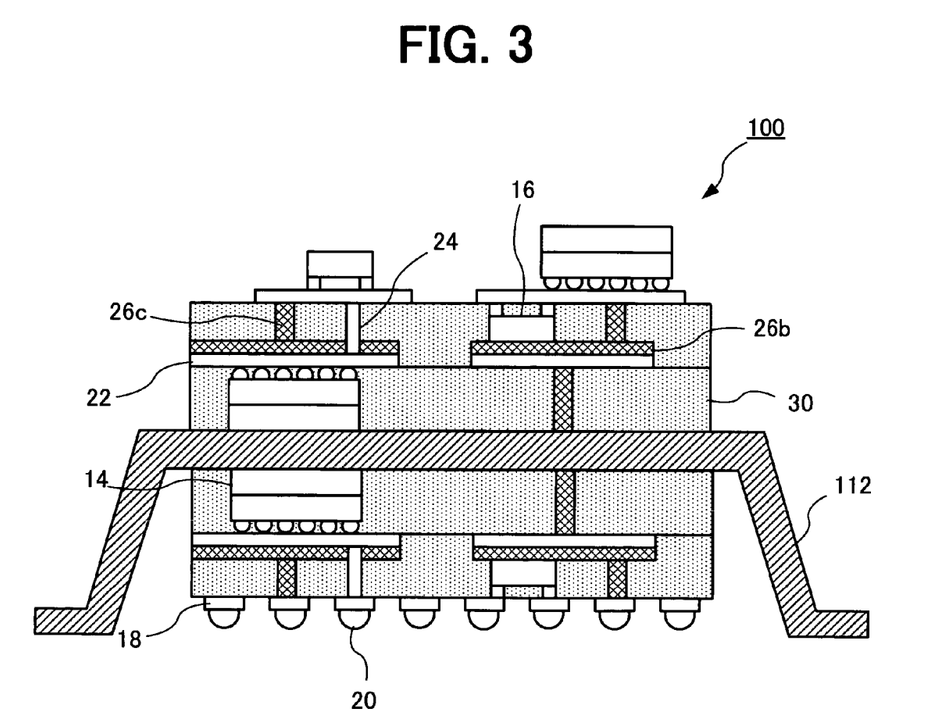
FIG. 3 is a cross-sectional view illustrating a multi-layered circuit board assembly according to a second preferred embodiment of the present invention.

FIG. 3 is a cross-sectional view illustrating a multi-layered circuit board assembly 100 according to a second preferred embodiment of the present invention. In FIG. 3, the same or corresponding components to those in FIG. 1 are represented by the same reference numerals and the same description will not be repeated.

The multi-layered circuit board assembly 100 includes electrical components (14 and 16) mounted on or in the assembly; conductive layers (22), which is electrically connected to the electrical components (14 and 16); high-temperature dissipation resins (26b and 26c), which are arranged so as to disperse heat generated in the assembly 100; and a molding resin 30 surrounding the electrical component (14 and 16).

The multi-layered circuit board assembly 100 further includes a copper frame 112; electrodes 18: connecting terminals 20 and via holes 24 for electrical connection. The connecting terminals 20 may be solder balls.

The electrical components include semiconductor chips 14 and passive devices 16. The molding resin 30 is of an epoxy resin, such as prepreg. The high-temperature dissipation resins 26b are coated on surfaces of intermediate conductive layers 22, which are formed inside the assembly 100. A high-temperature dissipation material 26c is filled in via holes for non-electrical connection.

The semiconductor chips 14 are mounted directly onto the copper frame 112. Connection terminals of the semiconductor chips 14 are electrically connected to the conductive layers 22. Some passive devices 16 are mounted directly onto the high-temperature dissipation layers 26b.

The high-temperature dissipation resins 26b and 26c are designed and arranged to form a heat transfer path, through which a heat generated in the assembly 100 is well dispersed. The high-temperature dissipation resins 26b and 26c may be made of a silica-alumina system material having an emissivity of about 0.92. The high-temperature dissipation material is an insulation material but not conductive. In general, ceramics has lower heat conductivity than metal, such as copper; however, ceramics has higher emmisivity (0.92) than copper (0.03). According to the present invention, a high-temperature dissipation material only transfer heat without making a short-circuit.

The multi-layered circuit board assembly 100 is fabricated using a build-up method after the electrical components 14 and 16 are mounted.

The copper frame 112 is provided with ends, which are used as leads to be connected to a motherboard, not shown. According to the second preferred embodiment, a substrate voltage (potential) can be applied to the ends of the copper frame 112.

Figure 4A:
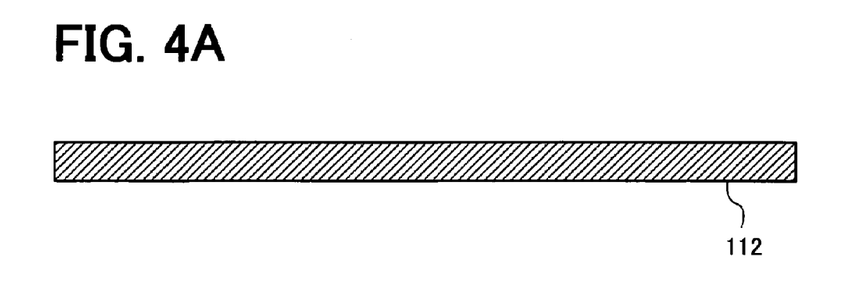
FIGS. 4A-4G are cross-sectional views illustrating fabrication steps of a multi-layered circuit board assembly, shown in FIG. 3.
Figure 4B:
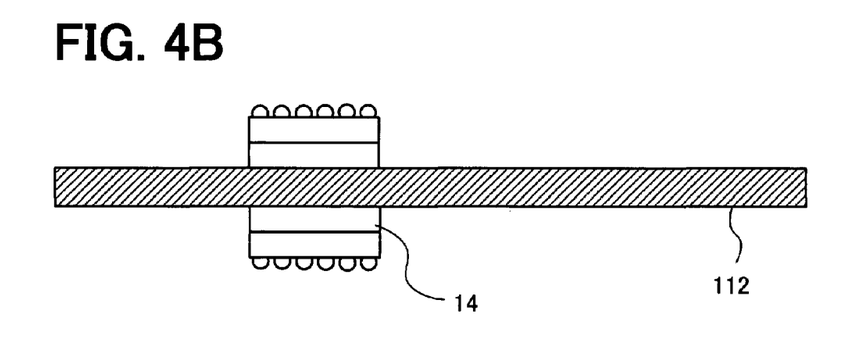
Figure 4C:
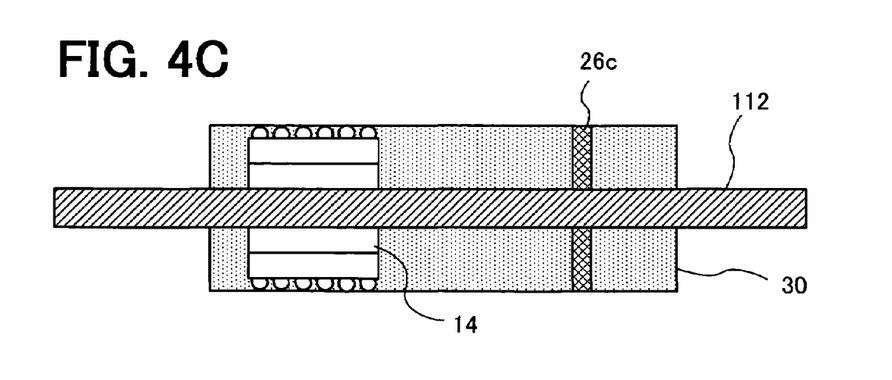

FIGS. 4A-4G are cross-sectional views illustrating fabrication steps of the multi-layered circuit board assembly 100 shown in FIG. 3. First, as shown in FIG. 4A, a copper (metal) frame 112 is prepared. Next, as shown in FIG. 4B, bottom surfaces of the semiconductor chips 14 are directly mounted or bonded on both surfaces of the copper frame 112. After that, as shown in FIG. 4C, the semiconductor chips 14 are resin-molded with an epoxy resin, such as prepreg, and the resin is thermo-set to form the molding resin 30.

The molding resin layer 30 has holes extending to the copper frame 112. The holes are filled with a high-temperature dissipation resin and the resin is heated to be hardened. The high-temperature dissipation resin 26c in the holes is functioning as a heat path to transfer heat generated in the assembly outwardly.

Figure 4D:
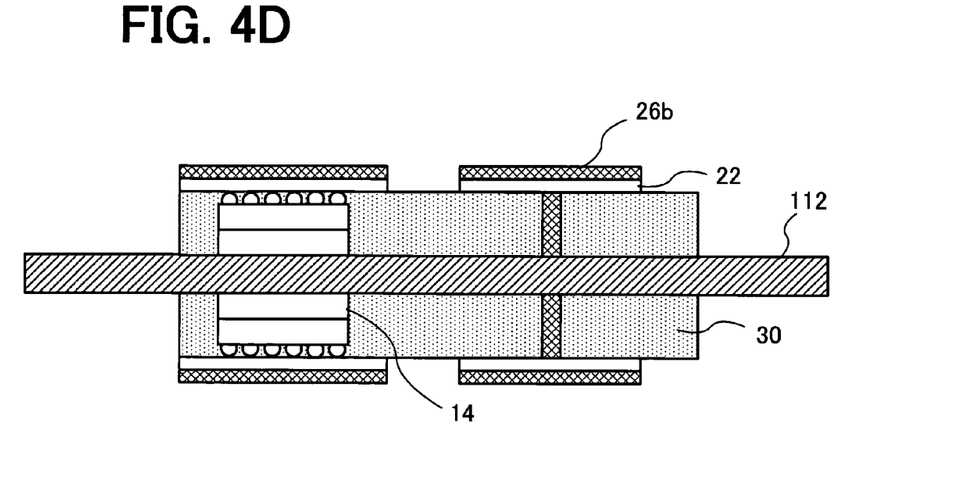

Next, conductive patterns (conductive layers) 22 are formed in a sputtering process and a plating process, then, a high-temperature dissipation resin is coated on the conductive layers 22. After that, the resin is heated to be hardened to form the high-temperature dissipation layers 26b, as shown in FIG. 4D. Electrodes of the semiconductor chips 14 are electrically connected to the conductive layers 22.

Figure 4E:
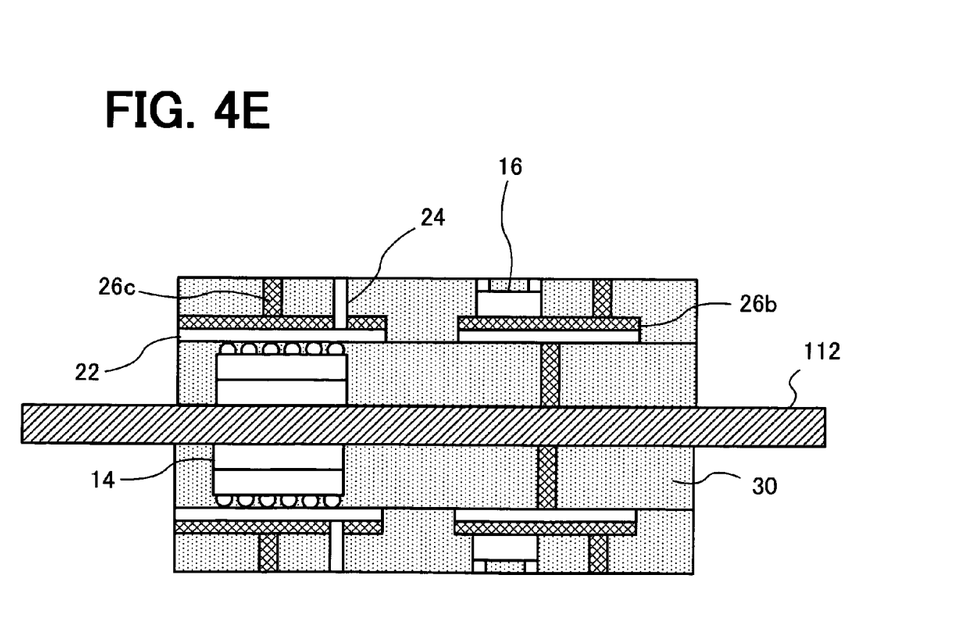

Subsequently, as shown in FIG. 4E, the passive devices 16 are mounted onto the high-temperature dissipation layers 26b, and are resin-molded. The resin is thermo-set (heated to be hardened) to form the molding resin layer 30 having holes (via holes) extending to the high-temperature dissipation layer 26b. The holes are filled with a high-temperature dissipation resin and the resin is heated to be hardened. The high-temperature dissipation resin 26c in the holes is functioning as a heat path to transfer heat generated in the assembly, especially at electrical components 14 and 16, outwardly. In the molding resin 30, through holes 24 are formed for electrical connection.

Figure 4F:
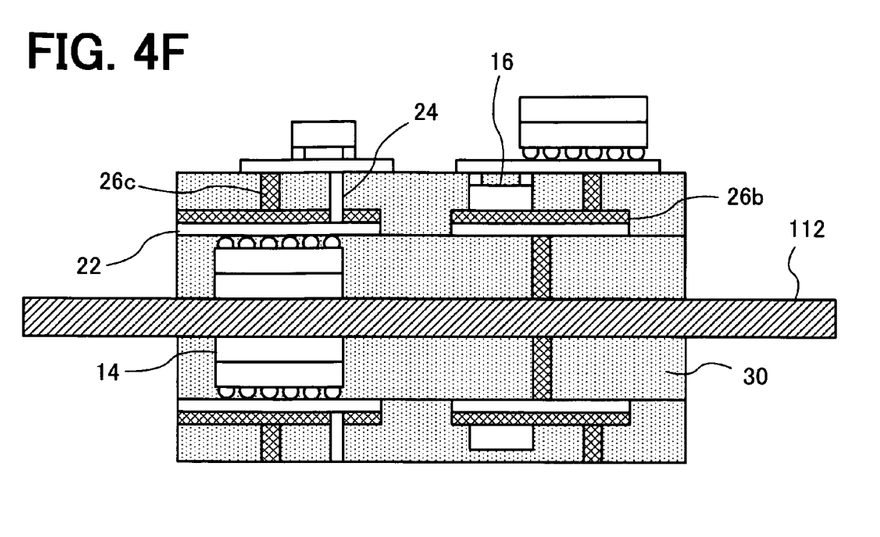
Figure 4G:
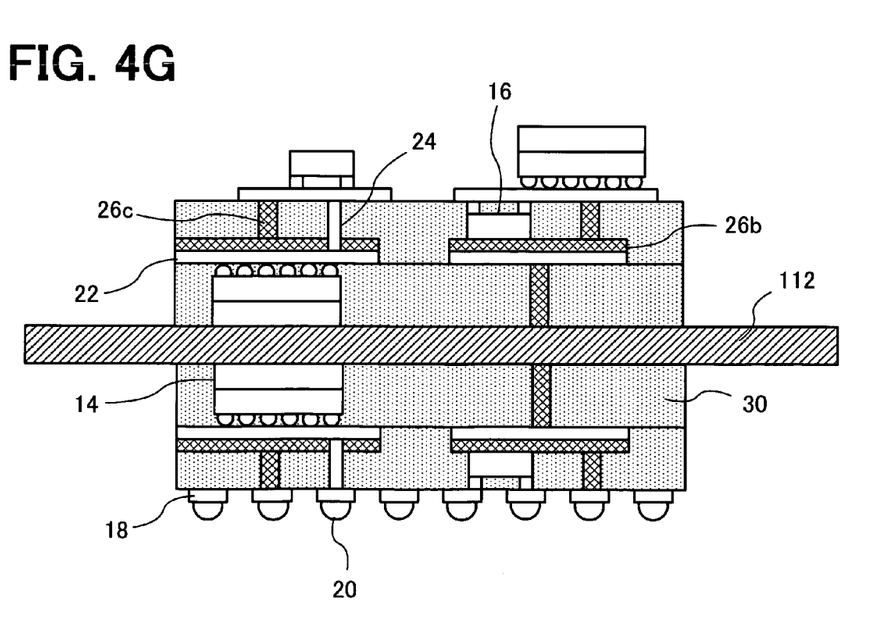

Next, as shown in FIG. 4F, conductive layers 22 are formed on the upper most surface of the assembly and electrical components (14 and 16) are mounted on the conductive layers 22. Subsequently, as shown in FIG. 4G, electrodes 18 for external connection are formed on the bottom surface of the assembly and connection terminals, such as solder balls, 20 are provided on the electrodes 18.

After that, as shown in FIG. 3, the ends of the copper frame 112 extending outwardly are bent using a molding die or the like, so that the bent ends are used as leads to be connected to a motherboard.

According to the above-described second preferred embodiment, heat, generated at electrical components in the assembly, is transferred and dispersed through the high-temperature dissipation resins 26b and 26c to the copper frame 112 and connection terminals 20, so that heat is dissipated all over the assembly. As a result, it can be prevent increase of a heat resistance and power consumption. Further, the assembly may not be deformed due to such a heat, and as a result, a reliability of the product becomes high.

Further, since the high-temperature dissipation resin is of an insulating material, it is unnecessary to consider a short-circuit problem in the assembly. In other words, freedom of circuit design is not disturbed by the high-temperature dissipation resin.

What is claimed is:

1. A circuit board assembly, comprising:
   a core substrate formed in the assembly;
   an electrical component mounted on the core substrate;
   a conductive layer formed at a side of the electrical component opposing the core substrate, so as to be connected to the electrical component;
   a high-temperature dissipation resin, which is of insulating material and is formed to cover a side of the conductive layer opposing the electrical component so as to disperse heat generated in the assembly; and
   a molding resin surrounding the electrical component and the high-temperature dissipation resin entirely, wherein:
   a first heat transfer path is formed to extend from the electrical component via the conductive layer and the high-temperature dissipation resin, and
   a second heat transfer path is formed to extend from the electrical component via the core substrate.

2. A circuit board assembly according to claim 1, wherein the high-temperature dissipation resin is formed to be in contact with the electrical component.

3. A circuit board assembly according to claim 1, further comprising:
   a via hole formed in the molding resin, wherein
   the high-temperature dissipation resin is filled in the via hole.

4. A circuit board assembly according to claim 1, wherein the high-temperature dissipation resin is coated on the electrical component.

5. A circuit board assembly according to claim 4, further comprising:
   a via hole formed in the molding resin, wherein
   the high-temperature dissipation resin is filled in the via hole.

6. A circuit board assembly according to claim 1, wherein the high-temperature dissipation resin is made of a silica-alumina system material having an emissivity of about 0.92.

7. A circuit board assembly according to claim 1, wherein
   the high-temperature dissipation resin is coated on a surface of the core substrate.

8. A circuit board assembly according to claim 7, wherein the high-temperature dissipation resin is coated on both surfaces of the core substrate.

9. A circuit board assembly according to claim 7, wherein the high-temperature dissipation resin is formed to be in contact with the electrical component.

10. A circuit board assembly according to claim 7, further comprising:
    a via hole formed in the molding resin, wherein
    the high-temperature dissipation resin is filled in the via hole.

11. A circuit board assembly according to claim 7, wherein
    the high-temperature dissipation resin is coated on the conductive layer and the electrical component.

12. A circuit board assembly according to claim 11, further comprising:
a via hole formed in the molding resin, wherein
the high-temperature dissipation resin is filled in the via hole.

13. A circuit board assembly according to claim 12, wherein
the high-temperature dissipation resin is arranged to form a heat transfer path, through which a heat generated in the assembly is well dispersed.

14. A circuit board assembly according to claim 7, wherein
the high-temperature dissipation resin is made of a silica-alumina system material having an emissivity of about 0.92.

15. A circuit board assembly according to claim 1, further comprising:
a conductive frame, which is formed in the assembly and extends out of the assembly to be electrically connected to an external board.

16. A circuit board assembly according to claim 15, wherein
the conductive frame is of copper.

17. A circuit board assembly according to claim 15, wherein
the high-temperature dissipation resin is coated on the conductive layer.

18. A circuit board assembly according to claim 15, wherein
the high-temperature dissipation resin is arranged to be in contact with the electrical component.

19. A circuit board assembly according to claim 15, further comprising:
a via hole formed in the molding resin, wherein
the high-temperature dissipation resin is filled in the via hole.

20. A circuit board assembly according to claim 15, wherein
the high-temperature dissipation resin is coated on the conductive layer and the electrical component.

21. A circuit board assembly according to claim 20, further comprising:
a via hole formed in the molding resin, wherein
the high-temperature dissipation resin is filled in the via hole.

22. A circuit board assembly according to claim 15, wherein
the high-temperature dissipation resin is made of a silica-alumina system material having an emissivity of about 0.92.

23. A circuit board assembly according to claim 1, wherein
the high-temperature dissipation resin formed to cover the side of the conductive layer opposing the electrical component has a thickness in the range from 30 to 200 µm.

24. A circuit board assembly, comprising:
a core substrate formed in the assembly;
an electrical component mounted on the core substrate;
a conductive layer formed at a side of the electrical component opposing the core substrate, so as to be connected to the electrical component;
a high-temperature dissipation resin, which is of insulating material and is formed to cover a side of the conductive layer opposing the electrical component so as to disperse heat generated in the assembly;
a molding resin surrounding the electrical component and the high temperature dissipation resin entirely, wherein:
a first heat transfer path is formed to extend from the electrical component via the conductive layer and the high-temperature dissipation resin,
a second heat transfer path is formed to extend from the electrical component via the core substrate; and
the high-temperature dissipation resin is coated on selected areas within the assembly comprising at least one of the conductive layer and a surface of the core substrate.

* * * * *